United States Patent [19]

Ronn

[11] 4,343,687

[45] * Aug. 10, 1982

[54] PRODUCTION OF CHAIN REACTIONS BY LASER CHEMISTRY

[75] Inventor: Avigdor M. Ronn, Great Neck, N.Y.

[73] Assignee: Research Foundation of City University of New York, New York, N.Y.

[*] Notice: The portion of the term of this patent subsequent to Oct. 28, 1997, has been disclaimed.

[21] Appl. No.: 153,170

[22] Filed: May 27, 1980

[51] Int. Cl.$^3$ .............................................. B01J 19/12
[52] U.S. Cl. .......................... 204/157.1 R; 204/162 R; 204/158 R; 204/158 HA
[58] Field of Search ..................... 204/157.1 L, 158 L, 204/158 HA, 162 R

[56] References Cited

U.S. PATENT DOCUMENTS 825,927  5/1980  Ronn et al. .
3,719,454  3/1973  Shang .............................. 204/158 L
4,043,308  8/1977  Cerkanowicz .................. 204/162 R
4,155,822 12/1977  Thomas .
4,230,546 10/1980  Ronn ............................... 204/158 R

FOREIGN PATENT DOCUMENTS 1429426  3/1976  United Kingdom ............ 204/162 R

OTHER PUBLICATIONS

Article published in AIAA entitled "Laser Spark Ignition of Chemically Reactive Gases", vol. 7, No. 2.

Primary Examiner—Howard S. Williams
Attorney, Agent, or Firm—Raymond J. Kenny; Ewan C. MacQueen

[57] ABSTRACT

Directed to the use of non-resonant laser energy to initiate reactions in reaction mixtures containing ingredients of the kind and in the amounts capable of forming chain reactions.

6 Claims, No Drawings

PRODUCTION OF CHAIN REACTIONS BY LASER CHEMISTRY

INTRODUCTION

The use of laser energy in inducing chemical reaction is now known. One aspect of such use related to isotope separation wherein laser light tuned to an absorption band of one isotope excites the isotope resonantly and selectively, followed by conversion of the excited isotope to a separable chemically different form. The process of U.S. Pat. No. 4,155,822 is an example. In another aspect, exemplified by co-pending Ronn U.S. application Ser. No. 825,927, now U.S. Pat. No. 4,230,546, laser power sufficient to cause dielectric breakdown of a dissociative molecular specie using laser light at a frequency displaced from any absorption frequency of the specie is employed to dissociate the specie in non-resonant fashion. Resonant processes depend upon the availability of a laser having a frequency matching an absorption band of a chemical compound which is to be excited. This is not presently possible in many cases. Another limitation of resonant processes is the relatively large number of photons of expensive laser light required to accomplish the required results. Again, dielectic breakdown (a plasma), while effective for many reactions, is accompanied by disadvantages including the production of unwanted byproducts for combustion processes.

Lee and Knystautas in an article entitled "Laser Spark Ignition of Chemically Reactive Gases" published in *AIAA Journal*, February 1969 at pages 312 et seq. reported on experiments wherein laser sparks generated using a ruby laser were employed in ignition studies of detonable and undetonable gaseous mixtures. These authors reported, inter alia, that even at beam energies as high as 7 joules ignition was not observed when the laser was operated in the normal lasing mode. They also observed that photoemission of electrons from a thin metallic rod inserted in the path of the laser beam 5 mm behind the focal point was found to be sufficient to induce the cascading breakdown action at the focal spot of the collimating lens, and stated that no energy absorption mechanism is present without breakdown and plasma production at the focal point.

Generally speaking, the present invention is directed to laser-induced reactions between at least two gaseous reactants which are thermodynamically capable of reacting with net release of energy which comprises at least partially mixing said reactants in a bounded space, irradiating the resulting mixture with at least one pulse of infrared laser light at a fluence insufficient to cause a spark to initiate the reaction.

A typical reaction which is facilitated in accordance with the invention is a combustion reaction involving ignition of a fuel oxidizer mixture, e.g., alcohols, hydrogen or a hydrocarbon reacting with an oxygen-containing gas, e.g., air. Such reactions are strongly exothermic, with an energy release on the order of about 60 k cal/mole. It is preferred to mix the reactants thoroughly, introduce them into a bounded space and irradiate the mixture with an infrared, e.g., a $CO_2$ TEA (transverse electric atmospheric) laser beam as a single pulse so as to initiate the reaction which is of the controlled chain or branched chain type. The energy requirement of the single infrared laser pulse is low and the laserinduced chain reaction proceeds rapidly with the products being only those associated with complete combusion, e.g., only water and carbon dioxide.

The laser beam may be collimated or unfocused; production of a spark (a plasma) is generally avoided. A laser-spark initiated combustion reaction tends to provide particulate matter and carbon monoxide in the reaction products. In addition, greater amounts of $No_x$ are formed. The observations indicate that a laser spark-induced reaction is less efficient and is less forceful and that the velocity of propagation is less than when generation of a spark (a plasma) is avoided.

Reactions which may be induced in accordance with the invention include, for example, hydrogen with chlorine, hydrogen, alcohols or gaseous and liquid hydrocarbons containing up to 30 carbon atoms with an oxygen-containing gas such as air. The invention is particularly effective in inducing combustion reactions in lean fuel mixtures.

A further feature of the invention is the discovery that the laser-induced combustion reaction can be utilized to promote reactions of or with other compounds present in the combustion zone. Thus, e.g., microfine particulate materials of metals or metal oxides can be produced by including within the bounded space for combustion a decomposable precursor compound such as a metal carbonyl, vanadium oxychloride, vanadium propoxide or silicon tetrachloride with the result that the combustion energy provides microfine particulate material. The fine particles may be incorporated in a porous support by also including the support material, e.g., alumina, within the bounded space. Such products are useful as catalysts.

The special effects contemplated in accordance with the invention arising from use of a laser beam having a controlled fluence are brought about through use of an infrared laser, e.g., the $CO_2$ TEA laser, and are not accomplished when an optical laser, such as the ruby laser is employed. Generally, the $CO_2$ laser will generate a beam having a wavelength of 10.6 micro-meters. Other laser systems which may be used for purposes of the invention include Neodymium: YAG; Neodymium: Glass at 1.06 micro-meters, as well as the more powerful solid state lasers such as Gallium Aluminum Arsenide (GaAlAs) at 0.78 micro-meters. Focusing of the laser beam is employed in instances where necessary to raise the beam fluence into the desired range, it being appreciated that in accordance with concepts of the invention concentration of the beam sufficient to cause a spark is avoided.

EXAMPLE I

A series of tests was conducted using a glass-walled reaction chamber provided with vacuum apparatus and means for supplying mixtures of gaseous fuels with oxygen-containing gas thereinto so as to investigate laser-induced combustion. Windows in opposite ends of the chamber permitted passage of laser light therethrough. A series of gaseous mixtures of air with respectively hydrogen, methane, ethane, and propane were admitted to the chamber and were irradiated with $CO_2$ laser beam at energy levels given in Table I. In most instances, a combustion resulted from exposure of the gaseous mixture to the laser beam. Behavior of the mixture during combustion was closely observed through the chamber walls. The following Table I sets forth the compositions of the various mixtures which were irradiated with laser light as aforedescribed and sets forth other information in regard thereto.

TABLE I

| Species | Fuel Pressure (torr) | Oxidizer Air Pressure (Total) (torr) | Laser Parameters Energy(Joules) Focused or Unfocused | Product Analysis (Infra-Red, Mass Spec., PVT) | Comments |
|---|---|---|---|---|---|
| $H_2$ | | | | | |
| Test 1 | 10 | 90 | 1.80–1.85J, P(20)10.6μ Unfocused | By freezing & PV = nRT $H_2O$ | Cu piece $H_2O$ was frozen, 95% conversion |
| Test 2 | 15 | 85 | Unfocused | PV = nRT $H_2O$ | Zn piece $H_2O$ was frozen, 98% conversion |
| Test 3 | 5 | 195 | 6.53J, Unfocused | Measurements designed to test effect of temperature on chain reaction | Heated (70–90° C.), Orange |
| Test 4 | 5.0 | 197 | 6.53J, Unfocused | Measurements designed to test effect of temperature on chain reaction | Heated (70–90° C.), Orange |
| Test 5 | 8.7 | 102.4 | 1.8J, 10 in. lens | | Orange explosion |
| Test 6 | 5.5 | 109.5 | 2.25J, 10 in. lens | | Orange explosion |
| Test 7 | 17 | 84.7 | 10 in. lens | PV = nRT $H_2O$ | $H_2O$ was frozen, 100% conversion |
| Test 8 | 15 | 382 | Unfocused | $H_2O$ vapor | |
| Test 9 | 25 | 180 | Unfocused | Infra-red & mass spectra indicated a singular product $H_2O$. No particles or $NO_x$ detected | |
| Test 10 | 6 | 194 | Unfocused | Infra-red & mass spectra indicated a singular product $H_2O$. No particles or $NO_x$ detected | +dust (stack) |
| Test 11 | 5 | 195 | Unfocused | Infra-red & mass spectra indicated a singular product $H_2O$. No particles or $NO_x$ detected | +dust |
| Test 12 | 10 | 190 | Unfocused | $H_2O$ vapor | Windows popped |
| Test 13 | 8 | 190 | Unfocused, 7J | $H_2O$ vapor | |
| Test 14 | 6 | 195 | Unfocused, 6,5J | $H_2O$ vapor | |
| Test 15 | 12 | 182 | Unfocused, 6J | $H_2O$ vapor | Orange explosion |
| Test 16 | 14 | 186 | Unfocused | N/A | Missile traveled 30–32", orange |
| Test 17 | 14 | 186 | Focused, 5 in. lens | N/A | Missile traveled 20–25" |
| Test 18 | 14 | 186 | Unfocused | N/A | Missile traveled 20.5–21.0", orange |
| Test 19 | 14 | 186 | Focused, 5 in. lens | N/A | Missile traveled 13.5", white puff |
| $CH_4$ | | | | | |
| Test 1 | 5.4 | 95.7 | 1.85J, 10 in. lens | $H_2O$, $CO_2$ (freezing) | Controlled explosion-orange blue flame no particles |
| Test 2 | 5.2 | 96.1 | 1.85J, 10 in. lens | $H_2O$, $CO_2$ (IR) | Controlled explosion-orange, no particles |
| Test 3 | 10 | 94 | 1.85J, 10 in. lens | $H_2O$, $CO_2$ (freezing) | Controlled explosion-bright orange flash no particles |
| Test 4 | 10.5 | 95.2 | 1.85J, 10 in. lens | $H_2O$, $CO_2$ (IR) | Controlled explosion-orange, no particles |
| Test 5 | 12.1 | 100.6 | 1.85J, 10 in. lens | $H_2O$, $CO_2$ (IR) | Controlled explosion-orange, no particles |
| Test 6 | 12.7 | 100.4 | 1.85J, 10 in. lens | $H_2O$, $CO_2$ (IR) | Controlled explosion-orange, no particles |
| Test 7 | 10.0 | 150.0 | 8J, 5 in. lens | $H_2O$, $CO_2$ (IR) | Controlled explosion, no particles |
| $C_2H_6$ | | | | | |
| Test 1 | 4.5 | 195 | 2J, 10 in. lens | | Explosion-windows fell off |
| Test 2 | 5 | 96 | 1.8J, 10 in. lens | $CO_2$, $H_2O$ (freezing) | Controlled explosion-orange blue no particles |
| Test 3 | 7.5 | 97.2 | 1.6J, 10 in. lens | $CO_2$, $H_2O$ (IR) | Controlled explosion-orange blue no particles |
| Test 4 | 5 | 95 | 1.8J, 10 in. lens | $CO_2$, $H_2O$ (Mass Spec.) | Controlled explosion-orange, no particles |
| Test 5 | 3.2 | 94.8 | 1.8J, 10 in. lens | $CO_2$, $H_2O$ (Mass Spec.) | Controlled explosion-orange, no particles |
| Test 6 | 6.8 | 95.2 | 2J, unfocused | $CO_2$, $H_2O$ (PVT) | Controlled explosion-orange, no particles |
| Test 7 | 5.2 | 98.8 | 2J, unfocused | $CO_2$, $H_2O$ (PVT) | Controlled explosion-orange blue no particles |
| Test 8 | 12.7 | 186.3 | 2J, 5 in. lens | | Explosion-missile flew off |
| $C_3H_8$ | | | | | |
| Test 1 | 3.7 | 96.3 | 1.8J, 10 in. lens | $CO_2$, $H_2O$ (IR) | Controlled explosion, orange-blue no particles |
| Test 2 | 4 | 96 | 1.6J, 10 in. lens | $CO_2$, $H_2O$ (PVT) | Controlled explosion, orange-blue no particles |
| Test 3 | 3 | 99 | 2.1J, 10 in. lens | $CO_2$, $H_2O$ (PVT) | Controlled explosion, orange flame no particles |
| Test 4 | 5 | 94.4 | 2J, 10 in. lens | $CO_2$, $H_2O$ (PVT) | Controlled explosion, orange-blue no particles |
| Test 5 | 11.9 | 181 | 2J, 5 in. lens | | Explosion-blew missile off |
| Test 6 | 12 | 188 | 2J, 5 in. lens | | Explosion-blew missile off |

Note:
In the table, the notations "Infra-red" or "IR" denote analyses by infra-red spectroscopy; "Mass Spec." denotes analyses by mass spectroscopy; "PVT" denotes Pressure, Volume, Temperature for calculations in accordance with the gas laws.
N/A = No Analysis Experiments using the laser beam of controlled power in laser-induced combustion demonstrated that combustion was provided with lower fuel to oxidizer ratios than is otherwise possible, that combustion was clean and complete with no detectable particulates or $NO_x$, that flame propagation was faster and dwell time was shorter than is otherwise achievable.

Other experiments were conducted to study combustion using laser sparks; i.e., laser-induced dielectric breakdown wherein a laser fluence on the order of 1000

Joules/cm$^2$ at the focal point was obtained, as compared to lower energy densities for the tests shown in Table I.

In many of the experiments conducted with $H_2$, $CH_4$, $C_2H_6$, $C_8H_{18}$, or with chromyl chloride-hydrogen mixtures using air as the oxidizer, no explosions were achieved when fluence conditions exceeded threshold for dielectric breakdown, and only a plasma spark was visible. When fluence conditions were reduced to controllable levels below threshold values, chain reactions culminating in explosions were easily achieved as illustrated in Table I.

$NO_x$ and particles were always found to be present when spark formation occurred during attempted laser initiation of the combustion of a fuel-oxidizer mixture whether or not an explosion resulted.

EXAMPLE 2

As an illustration of the applicability of the invention to provide useful particulate reaction products utilizing a laser-induced reaction between chromyl chloride ($CrO_2Cl_2$) as oxidizer and hydrogen as a fuel, the following experiment is given:

Into a container provided with an entrance and an exit for a laser beam a quantity of porous alpha-alumina of a quality suitable for catalyst support was introduced, and the container was then evacuated. Chromyl chloride at a pressure of 10 torr and hydrogen at a pressure of 15 torr were introduced into the container. A single $CO_2$ laser pulse at a fluence of 2 Joules/cm$^2$ was employed to irradiate the mixture. The irradiation initiated a chain reaction which continued rapidly until all the chromyl chloride was converted to a finely particulate $Cr_2O_3$. Most of the $Cr_2O_3$ so produced deposited upon the alumina beads. The products water and HCl were removed by evacuation and gentle heating of the container and the product supported $Cr_2O_3$ catalyst was then recovered.

EXAMPLE 3

The experiment of Example 2 was repeated in a similar evacuated cell containing porous alumina catalyst support beads into which iron carbonyl and oxygen were introduced at partial pressures of about 20 torr and 200 torr, respectively, and a single pulse of $CO_2$ laser light at an energy of 2 Joules initiated a chain reaction which, in microseconds, completely consumed the iron carbonyl and yielded finely particulate $Fe_2O_3$ which settled upon the supported material to yield catalytic grade material.

EXAMPLE 4

This example illustrates production of a $V_2O_5$ particulate catalyst in supported form. Into a glass reaction flask equipped with windows in opposing ends to permit entry and exit of laser light was introduced a quantity of porous alpha-alumina beads and the flask was then evacuated. Hydrogen, oxygen and vanadium oxychloride gasses at pressures of 30, 30 and 10 torr respectively were introduced into the flask. The output of a $CO_2$ laser at (being nonresonant) an energy of 1.5 Joules was focused by means of a 5 inch focal length lens into the flask, providing a fluence of 150 Joules/cm$^2$. A single laser pulse triggered a chain reaction amongst the reactants producing $V_2O_5$ in microfine particulate form together with $H_2O$ and HCl. $V_2O_5$ particles settled upon the alumina support beads and adhered tightly thereto. The product water and HCl were removed by evacuation and gentle heating.

EXAMPLE 5

The experiment of Example 4 was repeated using a similar evacuated cell to which $SO_2$, air and hydrogen were introduced at 0.15, 3 and 100 torr, respectively. A single light pulse of 1.5 microseconds duration from the $CO_2$ laser at a fluence of 5 Joules/cm$^2$ yielded a chain reaction the result of which was decomposition of the $SO_2$ to finely particulate free sulfur. The product $H_2O$ was removed by evacuation and gentle heating.

EXAMPLE 6

Into a flask of the type described in Example 4, beads of porous alumina catalyst support material were introduced. After evacuation, hydrogen and oxygen at partial pressures of 30 torr each were introduced together with one drop of vanadium propoxide $VO(C_3H_7O)_2$. A $CO_2$ laser beam having an energy of 1.5 joules (being nonresonant) was focused into the cell with a 5" lens. A single laser pulse at a fluence of 150 joules/cm$^2$ initiated a chain reaction amongst the cell contents and produced $V_2O_5$ particles in microfine form which settled by gravity and pressure shock into the support material to which the particles firmly adhered.

This example illustrates utilization of an explosive chain reaction to dissociate a spectator material itself unaccessible to the laser beam which initiated the reaction. The electrical energy required for the single initiating shot was minimal.

EXAMPLE 7

Silicon Deposition

A mixture of hydrogen 35 torr and 45 torr of oxygen and 15 torr of silicon tetrachloride ($SiCl_4$) were made to explode by triggering with a $CO_2$ TEA laser operating at 1.5 Joules and focused with a 10"f.1 lens within a bound volume. No visible spark formation occurred. Silicon was deposited from the explosive chain reaction and water and HCl were the byproducts. The latter were removed by evacuation and gentle heating. The silicon was deposited in three separate experiments on (a) alumina pellets (gamma—$Al_2O_3$) (b) a microscope glass slide (c) a silicon wafer.

The deposited silicon was identified by SEM and infrared spectroscopy. Additionally, the resistivity of the sample was calculated from a resistance measurement (4 point probe).

The infrared analysis indicated amorphous silicon with dangling Si-H bonds. The resistivity was calculated to be approximately $10^9$ ohm-cm from a resistance measurement of $5 \times 10^9$ ohm. The silicon deposit is useful for photovoltaic cells as well as for other semi-conductor applications.

Although the present invention has been described in conjunction with preferred embodiments, it is to be understood that modifications and variations may be resorted to without departing from the spirit and scope of the invention, as those skilled in the art will readily understand. Such modifications and variations are considered to be within the purview and scope of the invention and appended claims.

I claim:

1. A process for initiating chain reactions by laser chemistry which comprises mixing in a bounded space at least two compounds of a kind and in amounts capable of sustaining a chain reaction and initiating a reaction therebetween by irradiating the mixture with an infrared laser beam having a frequency not absorbed by said compounds and insufficient to create a spark.

2. A process according to claim 1 wherein said compounds are of a kind and are in amounts capable of sustaining combustion.

3. A process according to claim 2 wherein said mixture is in contact with a decomposable compound which is decomposed by said combustion.

4. A process according to claim 2 wherein said combustion is initiated by a single laser pulse.

5. A process according to claim 3 wherein said decomposable compound is a metal compound.

6. A process according to claim 2 wherein said compounds are fuels from the group consisting of hydrogen, hydrocarbons and alcohols and oxidizers from the group consisting of air, oxygen and chlorine.

* * * * *